United States Patent
Joo et al.

(10) Patent No.: US 6,946,341 B2
(45) Date of Patent: Sep. 20, 2005

(54) METHODS FOR MANUFACTURING STORAGE NODES OF STACKED CAPACITORS

(75) Inventors: Jae-hyun Joo, Seoul (KR); Wan-don Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 208 days.

(21) Appl. No.: 10/313,911

(22) Filed: Dec. 4, 2002

(65) Prior Publication Data

US 2003/0142458 A1 Jul. 31, 2003

(30) Foreign Application Priority Data

Dec. 5, 2001 (KR) .................................. 2001-76560

(51) Int. Cl.[7] .......................................... H01L 21/8242
(52) U.S. Cl. ............................ 438/240; 438/253; 438/3
(58) Field of Search ........................... 438/3, 238–256, 438/381, 390–399

(56) References Cited

U.S. PATENT DOCUMENTS

| 5,879,975 A | 3/1999 | Karlsson et al. ............... 438/16 |
| 6,326,259 B1 * | 12/2001 | Kim et al. .................. 438/240 |
| 2001/0016382 A1 | 8/2001 | Song et al. .................. 438/240 |

FOREIGN PATENT DOCUMENTS

| DE | 199 01 894 | 12/1999 |
| JP | 7094680 | 4/1995 |
| KR | 1998-0006341 | 3/1998 |

OTHER PUBLICATIONS

Notice to Submit Response for corresponding Korean Application No. 10–2001–0076560 dated Sep. 30, 2003 (English Translation).

Translation of an Official Letter as issued by the German Patent and Trademark Office dated Apr. 19, 2004.

* cited by examiner

Primary Examiner—H. Jey Tsai
(74) Attorney, Agent, or Firm—Myers Bigel Sibley & Sajovec

(57) ABSTRACT

Methods for forming a stacked capacitor include forming a first dielectric layer having a contact plug therein on an integrated circuit substrate. A second dielectric layer including a storage node hole is formed adjacent the contact plug on the first dielectric layer. A conductive layer is deposited into the storage node hole and on the second dielectric layer. The conductive layer has an associated work function. The conductive layer is oxidized to form a conductive oxide layer on the conductive layer. The conductive oxide layer has an associated work function that is sufficiently close to the work function of the conductive layer that the conductive layer and the conductive oxide layer operate together as the node of the stacked capacitor. The second dielectric layer is removed to define the node of the stacked capacitor. The stacked capacitor may be a metal-insulator-metal (MIM) capacitor and the conductive layer may be formed of a material selected from the group consisting of ruthenium (Ru), tungsten (W) and iridium (Ir). Related structures (devices) are also disclosed.

21 Claims, 10 Drawing Sheets

METHODS FOR MANUFACTURING STORAGE NODES OF STACKED CAPACITORS

RELATED APPLICATION

This application claims priority from Korean Application No. 2001-76560, filed Dec. 5, 2001, the disclosure of which is hereby incorporated herein by reference.

BACKGROUND OF THE INVENTION

The present invention relates to integrated circuit devices and, more particularly, integrated circuits including storage nodes and methods for manufacturing integrated circuit devices including a storage node of a capacitor.

Various integrated circuit devices, including semiconductor memory devices, include one or more capacitors fabricated (manufactured) on an integrated circuit substrate. There is a growing need to increase the capacitance within a limited area as integrated circuit (semiconductor) devices become more highly integrated. Various approaches have been proposed to provide a desired capacitance in a more limited space, for example, to provide increased density of memory cells in an integrated circuit memory device. One proposed approach is a thinning method for reducing the thickness of a dielectric layer. A second approach includes increasing the surface area of an electrode by using a three-dimensional electrode, such as cylinder-type electrode or a fin-type electrode. Another approach is to grow hemispherical grains (HSG) on the surface of an electrode. A further alternative approach is to use a dielectric layer having a dielectric constant which is significantly greater than that of a conventional oxide/nitride/oxide (ONO) dielectric.

For a polysilicon electrode, a low dielectric layer such as a Silicon Oxide ($SIO_N$) layer, capable of suppressing a reaction between the polysilicon electrode and a dielectric layer may be beneficial in obtaining stable leakage current characteristics. This is because, if a high dielectric layer is used, a dielectric layer having low dielectric constant may be generated between the high dielectric layer and the polysilicon layer. This may deteriorate the performance of the resulting capacity or due to degradation of the net dielectric strength of the capacitor dielectric layer. As a result, the potential increase in capacitance value using the thinning method may be limited for polysilicon electrodes.

When a metal-insulator-metal (MIM) capacitor is formed using a dielectric layer made with a high dielectric material (such as Ta2O5 or BST((BA,Sr)TiO3) or ferroelectric materials having a high dielectric constant) as the dielectric layer, the capacitor is typically fabricated using an electrode formed of a metal rather than a conventional polysilicon electrode. For example, the capacitor electrode material may be selected from the group consisting of platinum (Pt), ruthenium (Ru), iridium (Ir), rhodium (Rh) and osmium (Os), which typically do not react with the high dielectric layer but have high work function. In particular, ruthenium (Ru) may be easily etched by plasma containing oxygen, and thus is sometimes used an electrode of a MIM capacitor. As will be understood by those of skill in the art, the work function of a material is the minimum energy required to remove an electron from the Fermi level of the material into field-free space.

Storage nodes of a MIM capacitor can generally be classified into three types: a concave storage node, a cylindrical storage node and a stacked storage node. The stacked storage node generally has the most stable structure of these types of storage nodes and can generally be implemented with a finer (smaller) design rule than the other types of storage nodes. However, a stacked storage node may be difficult to manufacture, for example, because it may be hard to etch the metal used as the electrode of the stacked storage node.

It is known to form a dielectric layer having a contact plug therein on a semiconductor wafer in which a conductive region is formed during the manufacture of a stacked storage node. An etch stopper material layer and a sacrificial insulating material layer may subsequently be sequentially formed on the dielectric layer. Predetermined portions of the sacrificial insulating material layer and the etch stopper material layer may then be etched, thereby providing a structure including an etch stopper, a sacrificial dielectric layer, and a storage node hole exposing the contact plug.

After formation of the storage node hole, a relatively thick metal layer of a platinum group material is typically deposited on the integrated circuit substrate (semiconductor wafer), thereby filling the storage node hole, preferably completely. However, a void or seam may form in the metal layer in the storage node hole. As an increase of the capacitance of the stacked capacitor is typically provided by increasing the depth of the storage node hole relative to its diameter (i.e., its aspect ratio increases) it may be increasingly difficult to fill the storage node hole with the metal layer without forming a void or seam.

In a conventional manufacturing process, the metal layer deposited on the sacrificial dielectric layer is removed by etch back or chemical-mechanical polishing (CMP) after deposition to form a storage node in the storage node hole as the metal is not removed from the storage node hole by the removal process. The sacrificial dielectric layer is then removed and a dielectric layer and an upper electrode are sequentially formed on the integrated circuit device including the stacked storage node.

As a void or seam may form in the storage node of the conventional stacked capacitor storage node, the inner portion of the storage node typically may not be formed only of conductive materials. As a result, the storage node may be structurally weak and subject to being bent or deformed during a subsequent high-temperature heating process. In addition, the electrical characteristics of the storage node may deteriorate due to an increase in resistance.

A conventional process for fabricating a MIM capacitor having a ruthenium electrode will now be described with reference to FIGS. 1A and 1B. As shown in FIG. 1A, a first dielectric (interlevel insulating) layer 12, that includes a conductive contact plug 14, is formed on an integrated circuit (semiconductor) substrate 10. A second dielectric (mold oxide) layer 16 is deposited on the interlevel insulating layer 12. A portion of the mold oxide layer 16 is etched to define a storage node hole adjacent to (on) an exposed portion of the conductive plug 14. The storage node hole defines a lower electrode region 17. A conductive ruthenium layer 18 is deposited on the mold oxide layer 16 to fill the lower electrode region 17. As will be discussed below, however, a seam (void) 20 may result in the ruthenium layer 18 in the lower electrode region 17.

As shown in FIG. 1B, after deposition, the ruthenium layer 18 is polished to expose the surface of the mold oxide layer 16. As a result, the ruthenium layer 18 remains only in the lower electrode region 17 and defines a lower electrode (storage node) 18a. The remnant of the mold oxide layer 16 is removed as shown in FIG. 1B.

As also illustrated in FIG. 1B, a dielectric layer 22 is deposited to cover the lower electrode 18a and the interlevel insulating layer 12. A conductive layer, providing an upper electrode 25, is deposited that may fill the space between neighboring electrodes to provide a conventional MIM capacitor.

As seen in FIGS. 1A and 1B, such a conventional MIM capacitor may include defects. For instance, as the degree of integration of a integrated circuit device is increased, the size of the lower electrode region 17 is reduced, thereby increasing an aspect ratio of the resultant structure of the integrated circuit substrate 10. As a result, the ruthenium layer 18 may not completely fill the lower electrode region 17 and a relatively large seam 20 may result in the lower electrode 18a. The seam 20 may cause deformation of the lower electrode 18a during a subsequent process. Thus, the electrical characteristics of the MIM capacitor may be unstable. As shown in FIG. 1B, seams 20 are also formed in the upper electrode 25. More particularly, as the upper electrode 25 is generally forayed after depositing the dielectric layer 22, the aspect ratio of the resultant structure of the integrated circuit substrate 10 may become even greater and cause an undesirable number of seams 20 in the upper electrode 25.

One approach used in the prior art to reduce the problem of seams 20 in the lower electrode 18a is to thermally process (heat treat) the device at an elevated temperature after deposition of the ruthenium layer 18. As shown in FIG. 2, the heat treatment may reflow the ruthenium layer 18 and fill the seam 20. However, during the reflow of the ruthenium layer 18, the lower portion of the ruthenium layer 18, in contact with the conductive plug 14, may separate as the ruthenium flows to fill the seam 20. As a result, the quality of the contact between the ruthenium layer 18 and the conductive plug 14 may be reduced, such as by weakening the contact. The region designated "A" in FIG. 2 illustrates a region where the ruthenium layer 18 is separated from the conductive plug 14.

SUMMARY OF THE INVENTION

Embodiments of the present invention include methods for manufacturing a node of a stacked capacitor. A first dielectric layer having a contact plug therein is formed on an integrated circuit substrate. A second dielectric layer including a storage node hole is formed adjacent the contact plug on the first dielectric layer. A conductive layer is deposited into the storage node hole and on the second dielectric layer. The conductive layer has an associated work function. The conductive layer is oxidized to form a conductive oxide layer on the conductive layer. The conductive oxide layer has an associated work function that is sufficiently close to the work function of the conductive layer that the conductive layer and the conductive oxide layer operate together as the node of the stacked capacitor. The second dielectric layer is removed to define the node of the stacked capacitor. The stacked capacitor may be a metal-insulator-metal (MIM) capacitor and the conductive layer may be formed of a material selected from the group consisting of ruthenium (Ru), tungsten (W) and iridium (Ir).

In other embodiments of the present invention, the conductive layer is deposited in a cup shape in the storage node hole and the conductive oxide layer is formed in the cup shaped conductive layer to substantially fill the storage node hole. Alternatively, the conductive layer may be deposited to substantially fill the storage node hole and the conductive layer may be oxidized to form the conductive oxide layer extending from the conductive layer above the storage node hole.

The conductive layer may be oxidized at about 140° C. to about 160° C. in a plasma atmosphere containing about 4% to about 6% oxygen ($O_2$) and about 94% to about 96% nitrogen ($N_2$). The oxidizing of the conductive layer may be followed by thermally treating the conductive oxide layer at about 350° C. to about 450° C. in an oxygen atmosphere to reflow the conductive layer and the conductive oxide layer.

In further embodiments of the present invention, the node is a lower electrode of the stacked capacitor and, after removing the second dielectric layer, a capacitor dielectric layer is formed on the node of the stacked capacitor. A second conductive layer is deposited on the capacitor dielectric layer to define an upper electrode of the stacked capacitor. Depositing the second conductive layer may include depositing a conductive layer on the capacitor dielectric layer and oxidizing the conductive layer on the capacitor dielectric layer to form a conductive oxide layer. The conductive layer on the dielectric layer may have a work function substantially the same as a work function of the conductive oxide layer on the capacitor dielectric layer so that they operate together as the upper electrode of the capacitor. In some embodiments, a plurality of lower electrodes are formed on the integrated circuit substrate and the conductive oxide layer on the capacitor dielectric extends between ones of the plurality of lower electrodes to define an upper electrode for the plurality of lower electrodes.

In other embodiments of the present invention, methods of manufacturing a node of a stacked capacitor are provided. A first dielectric layer having a contact plug therein is formed on an integrated circuit substrate. A second dielectric layer including a storage node hole is formed adjacent the contact plug on the first dielectric layer. A conductive layer is deposited into the storage node hole and on the second dielectric layer. The conductive layer is oxidized to form a conductive oxide layer on the conductive layer and the second dielectric layer is removed to define the node of the stacked capacitor including the conductive layer and the conductive oxide layer.

In further embodiments of the present invention, stacked capacitors are provided including an integrated circuit substrate including a contact plug therein. A conductive layer is positioned on the integrated circuit substrate adjacent the contact plug. A conductive oxide layer that is an oxide of the conductive layer is positioned on the conductive layer. The conductive oxide layer and the conductive layer together define a lower electrode of the stacked capacitor. The capacitor may also include a dielectric layer on an upper surface of the lower electrode away from the integrated circuit substrate and an upper electrode of the capacitor on the dielectric layer. The upper electrode may include a conductive layer and a conductive oxide layer comprising an oxide of the conductive layer of the upper electrode. The conductive layer of the upper electrode may be formed of a material selected from the group consisting of ruthenium (Ru), tungsten (W) and iridium (Ir). In other embodiments, the conductive layer of the upper electrode may be formed of a material selected from the group consisting of platinum (Pt), ruthenium (Ru), iridium (Ir), rhodium (Rh), osmium (Os), or is titanium nitride (TiNx) layer or a tantalum nitride (TaNx). The dielectric layer may be formed from a material selected from the group consisting of Ta2O5, (Ba,Sr)TiO3 (BST), PbTiO3, Pb(Zr,Ti)O3(PZT), SrBi2Ta2O5(SBT), a (Pb,La)(Zr,Ti)O3 and BaTiO3(BTO).

In other embodiments of the present invention, integrated circuit devices are provided including a plurality of stacked capacitors. An integrated circuit substrate includes a plurality of lower electrodes therein. A dielectric is on a surface of the plurality of lower electrodes away from the integrated circuit substrate. An upper electrode is on a surface of the dielectric opposite from the plurality of lower electrodes. The upper electrode includes a conductive layer and a conductive oxide layer that is an oxide of the conductive layer of the upper electrode. The upper electrode extends between ones of the plurality of lower electrodes. The conductive oxide layer may have an associated work function that is sufficiently close to a work function of the conductive layer that the conductive layer and the conductive oxide layer operate together as the upper electrode of the plurality of stacked capacitors.

Further embodiments of the present invention provide MIM capacitors including: a semiconductor substrate; a lower electrode being composed of a conductive layer, which is formed as a cup shape on the semiconductor substrate, and a conductive oxide layer that is made by oxidizing the conductive layer and fills a space defined by the conductive layer; a dielectric layer for covering the upper portion of the lower electrode; and an upper electrode being formed on the dielectric layer. The conductive oxide layer is a conductive material that has almost the same work function as the conductive layer and the conductive layer is formed of a material selected from the group consisting of ruthenium (Ru), tungsten (W) and iridium (Ir).

In yet other embodiments of the present invention, MIM capacitors are provided, including: a semiconductor substrate; a lower electrode being composed of a conductive layer that is formed as a stack type on the semiconductor substrate, and a conductive oxide layer that is made by oxidizing the conductive layer and is formed on the conductive layer to a predetermined thickness; a dielectric layer for covering the lower electrode; and an upper electrode being formed on the dielectric layer. The conductive oxide layer is a conductive material that has almost the same work function as the conductive layer and the conductive layer is formed of a material selected from the group consisting of ruthenium (Ru), tungsten (W) or iridium (Ir).

In further embodiments of the present invention, MIM capacitors are provided including: a lower electrode formed on a semiconductor substrate; a dielectric layer for covering the upper portion of the lower electrode; and an upper electrode being composed of a conductive layer that is formed on the dielectric layer, and a conductive oxide layer that is made by oxidizing the conductive layer. The conductive oxide layer, which constitutes the upper electrode, is a conductive material that has almost the same work function as the conductive layer, and the conductive layer, which also constitutes the upper electrode, is formed of a material selected from the group consisting of ruthenium (Ru), tungsten (W) and iridium (Ir).

In other embodiments of the present invention, methods are provided for fabricating a MIM capacitor, including: forming a mold oxide layer having a conductive plug on a semiconductor substrate; etching a predetermined portion of the mold oxide layer to expose the conductive plug so that a lower electrode region is defined; filling a conductive layer into the lower electrode region of the mold oxide layer; oxidizing the conductive layer to form a conductive oxide layer to be higher than the mold oxide layer; and removing the mold oxide layer. The mold oxide layer has a thickness such that the conductive layer can be fully reclaimed without seams. The conductive oxide layer is a conductive material that has almost the same work function as the conductive layer. The conductive layer is formed of a material selected from the group consisting of ruthenium (Ru), tungsten (W) and iridium (Ir).

In yet further embodiments of the present invention, methods of fabricating a MIM capacitor are provided, including: forming a plurality of lower electrodes to a predetermined thickness on a semiconductor substrate; forming a dielectric layer on the lower electrode; forming a conductive layer for an upper electrode on the dielectric layer; and forming a conductive oxide layer by oxidizing the conductive layer to completely fill a space between the lower electrodes, thereby forming an upper electrode that is made of the conductive layer and the conductive oxide layer. The conductive oxide layer is a conductive material that has almost the same work function as the conductive layer. The conductive layer of the upper electrode is formed of a material selected from the group consisting of ruthenium (Ru), tungsten (W) and iridium (Ir).

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1A:
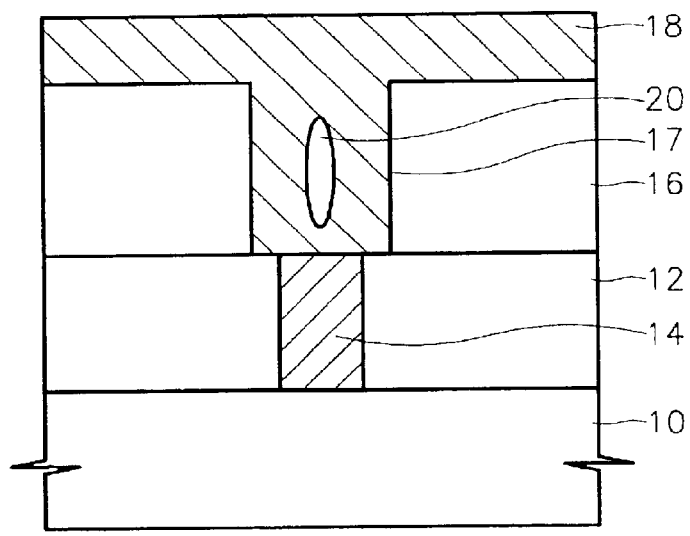
FIGS. 1A and 1B are cross-sectional diagrams illustrating a conventional method of fabricating a stacked capacitor.
Figure 1B:
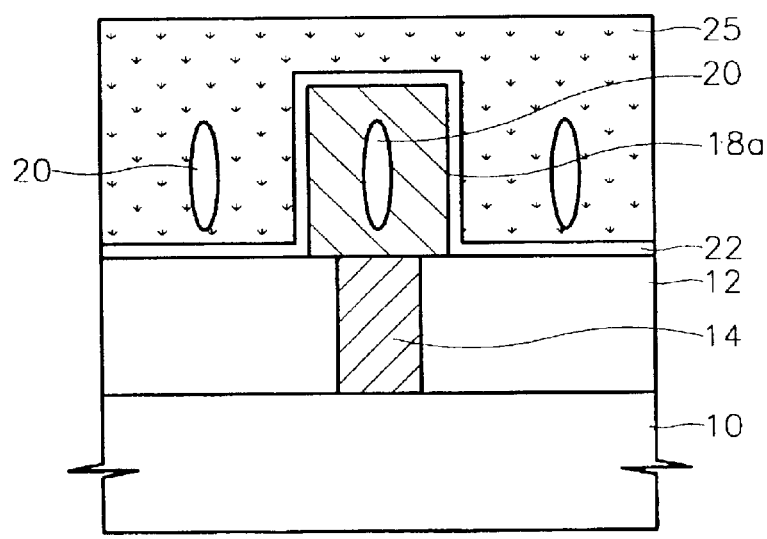
Figure 2:
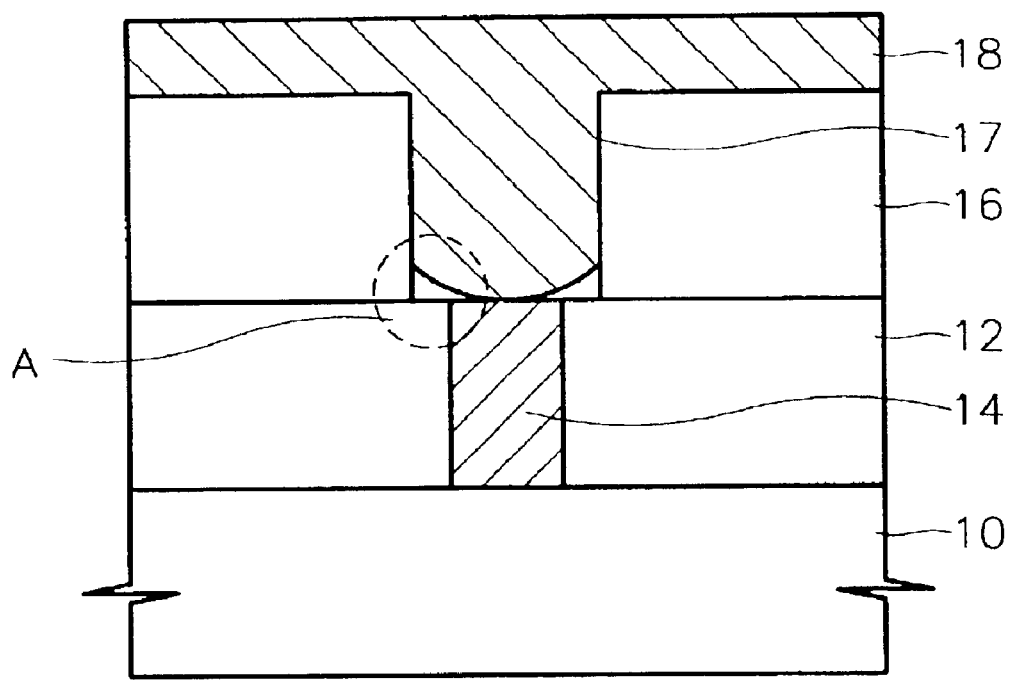
FIG. 2 is a cross-sectional diagram illustrating a node of a stacked capacitor after reflow according to the prior art.

The present invention now will be described more fully hereinafter with reference to the accompanying drawings, in which typical embodiments of the invention are shown. This invention may, however, be embodied in many different forms and should not be construed as limited to the embodiments set forth herein.

Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well. Terms used herein are to be given their ordinary meaning unless explicitly defined otherwise herein.

Integrated circuit devices and methods for forming such devices in accordance with embodiments of the present invention will now be described with reference to FIGS. 3A–3D. In particular, FIGS. 3A–3D illustrate embodiments of operations for manufacturing a storage node and a stacked capacitor including the storage node. As used herein, the term "storage node" refers to an electrode of a capacitor.

Figure 3A:
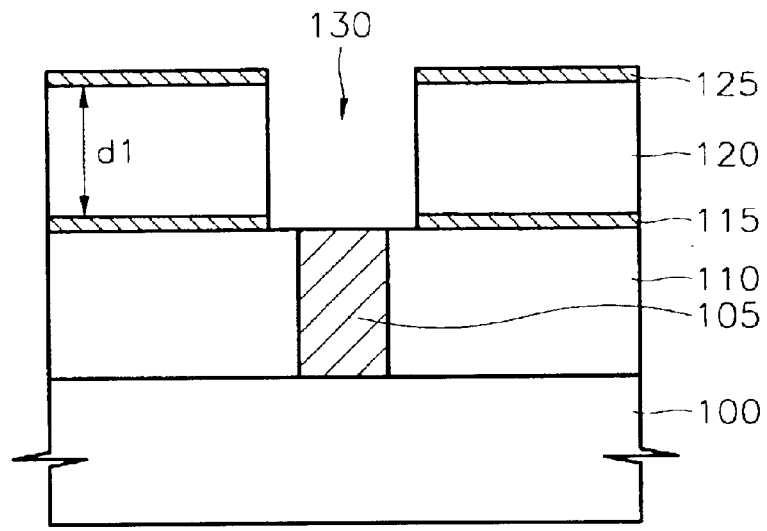
FIGS. 3A through 3D are cross-sectional diagrams illustrating manufacturing of a stacked capacitor according to embodiments of the present invention.

As shown in FIG. 3A, a first dielectric (interlevel insulating) layer 110, which includes a conductive contact plug 105, is deposited on an integrated circuit substrate 100. For example, the substrate may include a metal on silicon (MOS) transistor or other structures defining, with the capacitor, a memory cell. The conductive plug 105 may be in electrical contact with one or more junction regions of the MOS transistor or with a conductive layer connected with one or more of the junction regions.

A first etch stopper 115, a second dielectric (mold oxide) layer 120 and a second etch stopper 125 are sequentially deposited on the interlevel insulating layer 110. The first and second etch stoppers 115, 125 may be, for example, silicon nitride layers. The mold oxide layer 120 may be, for example, a silicon oxide layer. The first and second etch stoppers 115, 125 and the mold oxide layer 120 are etched to expose the conductive contact plug 105. The etching operation defines a storage node hole or lower electrode region 130. The thickness d1 of the mold oxide layer 120 and the diameter of the lower electrode region 130 may be selected to provide a desired capacitance for a capacitor that will be fabricated on the integrated circuit substrate 100 including a lower electrode to be formed in the lower electrode region 130.

Figure 3B:
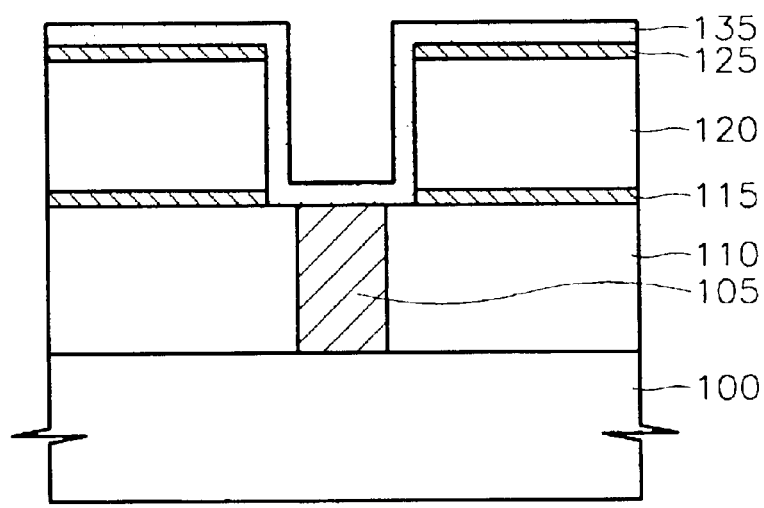

Referring now to FIG. 3B, a conductive layer 135, such as a ruthenium layer, is deposited on the second etch stopper 125 and into the lower electrode region 130 to form a conductive layer of a lower electrode. The ruthenium layer 135 may be deposited using known methods to a predetermined thickness selected to provide a desired structure in accordance with embodiments of the present invention. The deposition of the ruthenium layer 135 may be performed by, for example, by one or more of chemical vapor deposition (CVD), physical vapor deposition (PVD), and/or atomic layer deposition (ALD). The conductive layer 135 for the lower electrode, may, be need not be, formed of ruthenium. For example, the conductive layer 135 may be formed from a material selected from the group consisting of ruthenium (Ru), tungsten (W) or iridium (Ir). In particular embodiments, the conductive layer 135 is formed from a material for which, if a conductive oxide layer is formed by oxidizing the conductive layer, the conductive oxide layer will have a work function that is sufficiently close to that of the conductive layer so that they together operate as the lower electrode of the capacitor. For example, the conductive oxide layer may have almost the same work function as the conductive layer.

Figure 3C:
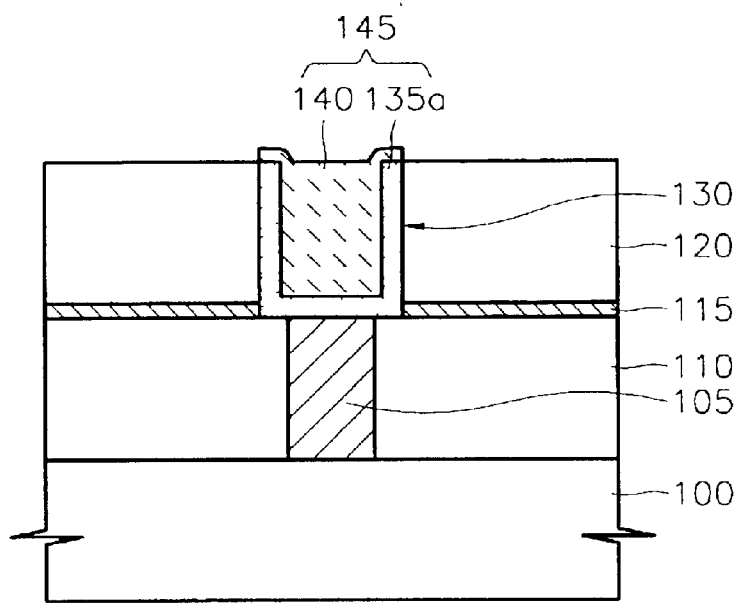

Referring now to FIG. 3C, the ruthenium layer 135 is removed from the surface of the mold oxide layer 120, for example, by chemical mechanical polishing until the second etch stopper 125 is exposed. As a result, the ruthenium layer 135a is left only in the lower electrode region 130 and along the corresponding faces of the mold oxide layer 120 and the interlevel insulating layer 110 including the contact plug 105. Thus, a storage node (here a lower electrode) including the ruthenium layer 135a is electrically separated from neighboring nodes, which may include a corresponding ruthenium layer. The second etch stopper 125 may then be removed, for example, by a conventional wet etching process.

As also shown in FIG. 3C, a conductive oxide layer 140, such as a ruthenium oxide layer, is formed by performing an oxidization process on the ruthenium layer 135a to fill the lower electrode region 130. As shown in FIG. 3C, the conductive oxide layer 140 is positioned within (i.e., filling the volume bounded by) the ruthenium layer 135a. As a result, a lower electrode 145 is formed that includes the remaining ruthenium layer 135a and the ruthenium oxide layer 140. The remaining ruthenium layer 135a may be formed along the sidewalls and bottom of the lower electrode region 130 to a predetermined thickness. The resulting remaining ruthenium layer 135a defines a cup shape. The ruthenium oxide layer 140, thus is formed to substantially fill a space bounded by the sides and bottom of the remaining ruthenium layer 135a.

When the ruthenium layer 135 is oxidized to form the ruthenium oxide layer 140, the volume of the ruthenium oxide layer 140 typically expands to about 1.8 times the volume of the ruthenium layer 135. This may allow the ruthenium oxide layer 140 to be readily grown to fill the space not occupied by the remaining ruthenium layer 135a in the lower electrode region 130. The occurrence of seams in the lower electrode region 130 may, thereby, be reduced or even prevented. The thickness of deposition of the ruthenium layer 135 may be selected based on the diameter of the lower electrode region 130 and the expected expansion of the ruthenium oxide layer 140 to fill the lower electrode region 130.

The ruthenium oxide layer 140 is a conductive material that may have almost the same work function as the ruthenium layer 135. As a result, the use of the ruthenium oxide layer 140 as part of the lower electrode is not expected to cause electrical problems in the performance of the resulting capacitor.

A typical conventional oxidization process includes thermal treatment at about 500° C. under oxygen atmosphere. The oxidization of the remaining ruthenium layer 135a in accordance with embodiments of the present invention may be carried out at about 140° C. to about 160° C. in a plasma atmosphere containing about 4% to about 6% oxygen ($O_2$) and about 94% to about 96% nitrogen ($N_2$). In addition, the oxidizing of the conductive layer 135a may be followed by thermally treating the conductive oxide layer 140 at about 350° C. to about 450° C. in an oxygen atmosphere to reflow the conductive layer 135a and the conductive oxide layer 140.

Figure 4A:
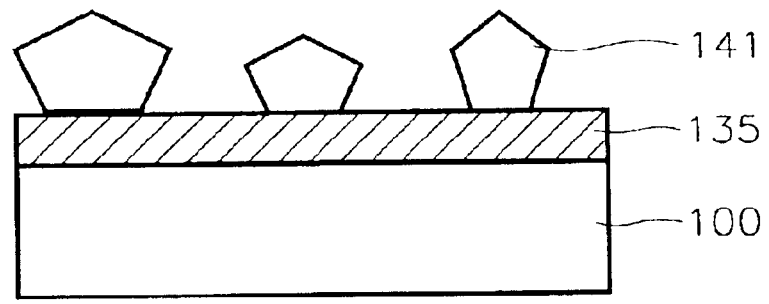
FIG. 4A is a cross-sectional diagram illustrating a ruthenium oxide layer formed by general oxide deposition.
Figure 4B:
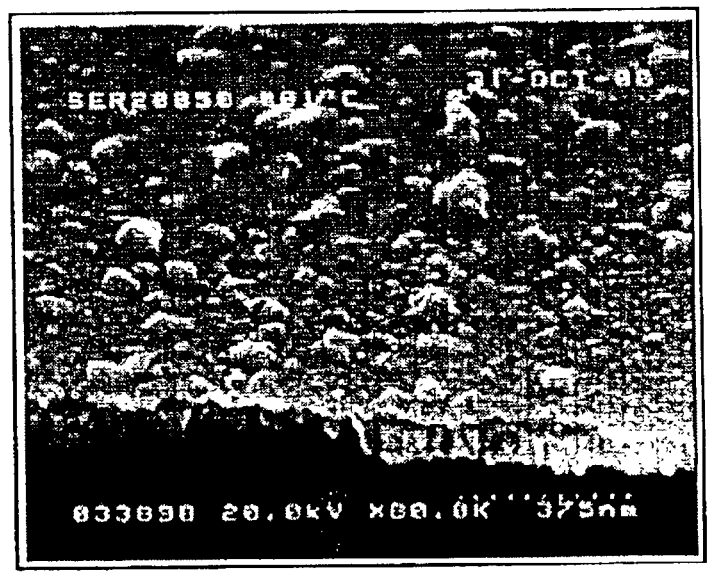
FIG. 4B is a scanning electron microscope (SEM) image of a ruthenium oxide layer formed by general oxide deposition.
Figure 5A:
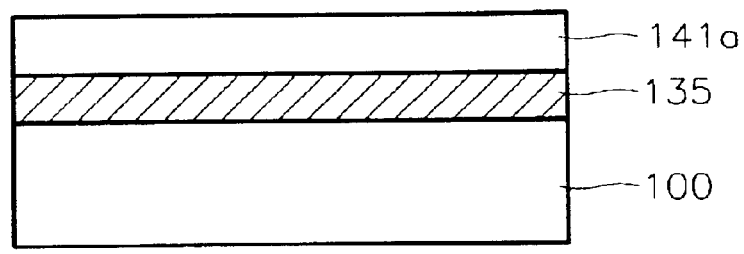
FIG. 5A is a cross-sectional diagram illustrating a ruthenium oxide layer formed by oxide deposition according to embodiments of the present invention
Figure 5B:
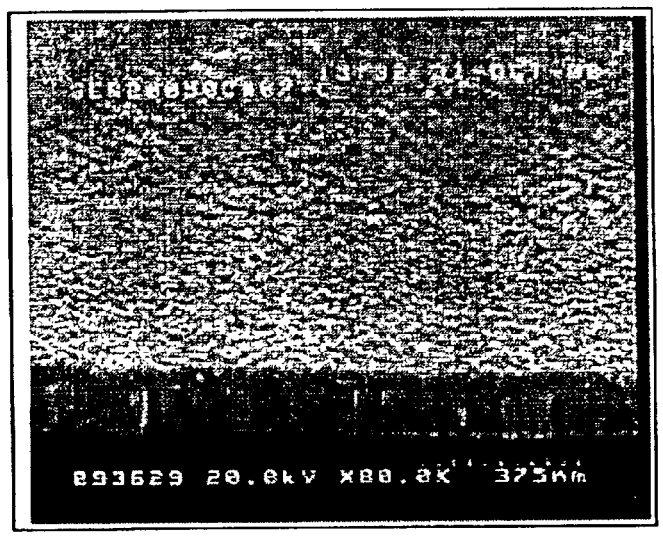
FIG. 5B is a SEM image of a ruthenium oxide layer formed by oxide deposition according to embodiments of the present invention.

The oxidization of the remaining ruthenium layer 135a, in various embodiments of the present invention, provides a smooth upper surface across at least a portion of the ruthenium oxide layer 140. Generally, the ruthenium layer 135 may be oxidized in a conventional manner to form the ruthenium oxide layer 140 in the form of grains as shown in FIGS. 4A and 4B. However, the ruthenium oxide layer 140, when formed by a conventional oxidization process, may have irregularities on its surface as shown in the SEM image of FIG. 4B. In accordance with embodiments of the present invention, the ruthenium layer 135 is oxidized in a plasma containing oxygen, or is processed with oxygen plasma, and then is thermally heated in an oxygen atmosphere. As a result, as can be seen from FIGS. 5A and 5B, a ruthenium oxide layer 141a having a smooth surface may be provided.

Figure 6:
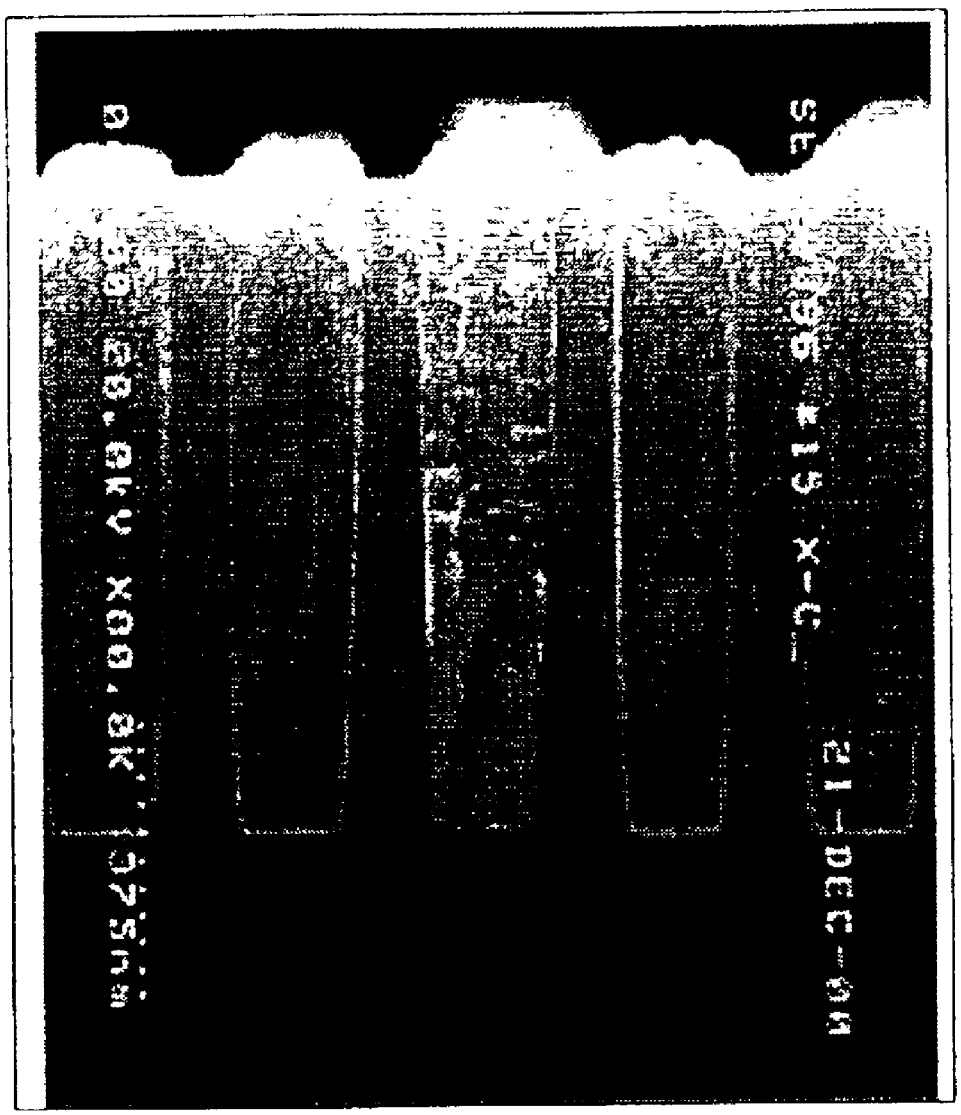
FIG. 6 is a SEM image of a lower electrode according to embodiments of the present invention.

After the ruthenium oxide layer 140 is formed, a high-temperature reflow process may be performed thereon. Processing in accordance with such embodiments of the present invention may reduce or prevent the occurrence of fine pores or seams in the ruthenium oxide layer 140. Furthermore, any seams still present in the ruthenium oxide layer 140 may be smaller than the size of seams in a conventional ruthenium oxide layer. Accordingly, the portion of the remaining ruthenium layer 135a positioned below the ruthenium oxide layer 140 may remain adjacent the underlying layers 105, 110 without moving into the seams during the high temperature reflow process. This may reduce the likelihood of or prevent a loose connection between the resulting lower electrode and the conductive plug 105. FIG. 6 is an SEM image illustrating a lower electrode according to embodiments of the present invention having substantially no seams.

Figure 3D:
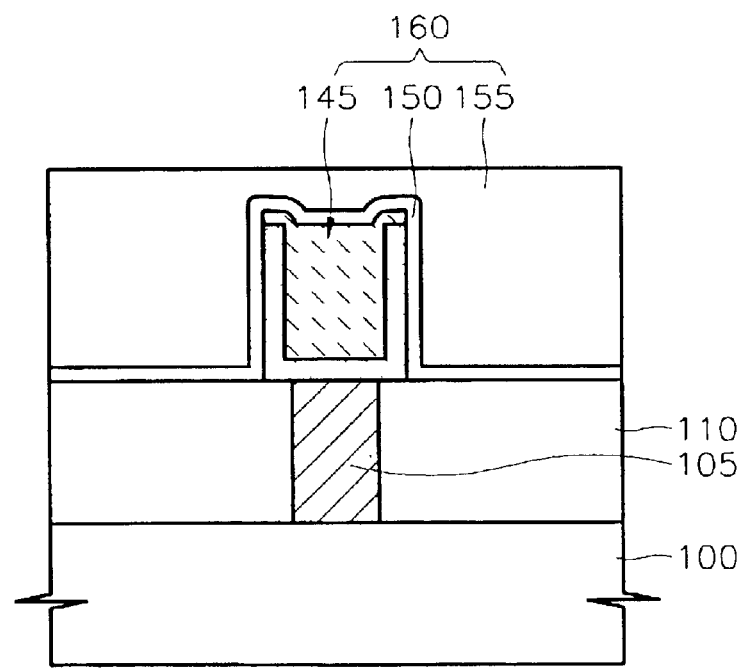

Referring now to FIG. 3D, the remaining mold oxide layer 120 and the first etch stopper 115 are removed, for example, by a conventional method. A capacitor dielectric layer 150 is formed on the interlevel insulating layer 110 and the lower electrode 145. The dielectric layer 150 may be a Tantalum Pentoxide ($Ta_2O_5$) layer, a titante (($Ba,Sr)TiO_3$, i.e., BST) layer, a lead titanate ($PbTiO_3$) layer, a lead zirconia titanate ($Pb(Zr,Ti)O_3$, i.e., PZT) layer, a Strontium Bismuth Tantalum Oxide ($SrBi_2Ta_2O_5$, i.e., SBT) layer, a Lead, Lanthanum Zirconia, Titanate (($Pb,La)(Zr,Ti)O_3$) layer, a bismuth titanate ($Bi_4Ti_3O_{12}$) layer, or a Barium Titanate ($BaTiO_3$, i.e., BTO) layer.

An upper electrode 155 is formed on the dielectric layer 150 to provide a capacitor 160. The upper electrode 155 can be formed of a conductive layer in which a leakage current is not generated even with a high dielectric layer 150, such as described above. For example, the upper electrode 155 may be a metal such as platinum (Pt), ruthenium (Ru), iridium (Ir), rhodium (Rh) and osmium (Os), or a conductive chemical compound such as a titanium nitride (TiNx) layer or a tantalum nitride (TaNx) layer. The work function of platinum (Pt) is generally about 5.34 eV. The work functions of ruthenium (Ru) and ruthenium oxide (RuO) are generally about 4.8 eV. The work functions of iridium (Ir) and iridium oxide ($IrO_2$) are generally about 5.3 eV.

Thus, the lower electrode region 130 may be filled with the ruthenium layer 135, and the ruthenium oxide layer 140. As such, the ruthenium oxide layer 140 may provide conductivity and operate as part of the electrode. Furthermore, in accordance with various embodiments of the present invention, the ruthenium oxide layer 140 may be grown to a volume larger than the volume of the ruthenium layer 135 to readily fill the lower electrode region 130. For this reason, it may be possible to suppress or even prevent the occurrence of seams in the lower electrode region 130.

Figure 7A:
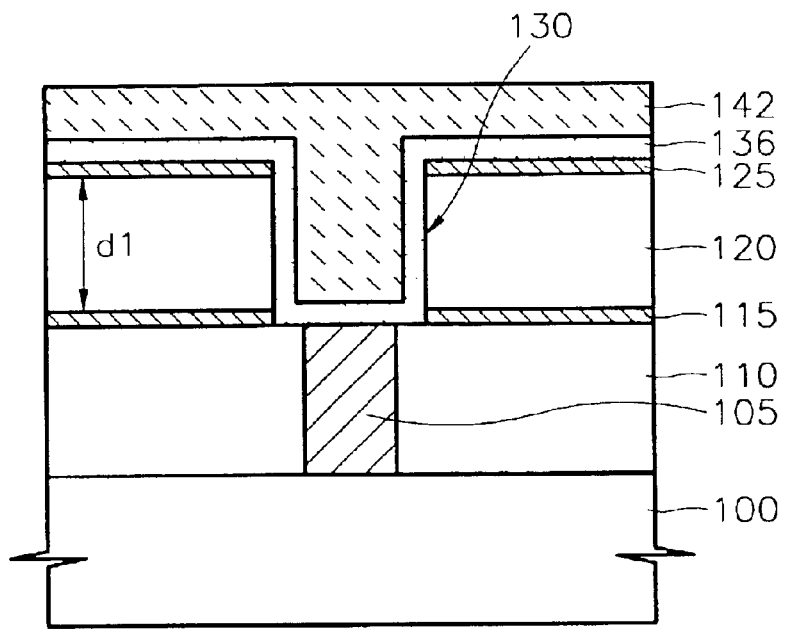
FIGS. 7A and 7B are cross-sectional diagrams illustrating manufacturing of a MIM capacitor according to other embodiments of the present invention.
Figure 7B:
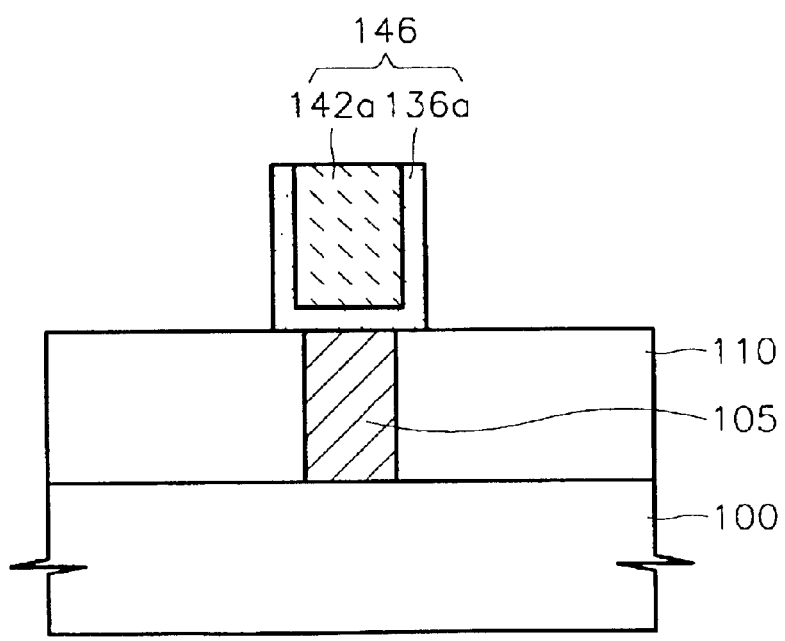

Further embodiments of the present invention will now be described with reference to FIGS. 7A and 7B. FIGS. 7A and 7B are cross-sectional diagrams illustrating operations for manufacturing a MIM capacitor according to other embodiments of the present invention. Operations as described above with reference to FIG. 3A are substantially the same for the like numbered reference numerals in FIG. 7A and will not be further described herein.

Referring now to FIG. 7A, the illustrated operations differ in that the ruthenium layer 135 has been subjected to an oxidization process before the ruthenium has been removed from the second etch stopper 125 to form a conductive oxide layer 142. The ruthenium layer 135, after oxidization, is illustrated in FIG. 7A as layer 136. The oxidization process may be performed on the ruthenium layer 135 until regions of the lower electrode region 130 no containing ruthenium are filled by the conductive oxide layer 142. As described with reference to FIGS. 3A–3D, the oxidization process may be carried out at about 140-160° C. in a plasma atmosphere containing about 4–6% of oxygen ($O_2$) and about 94–96% of nitrogen ($N_2$). Following oxidization, the ruthenium layer 136 and oxide layer 142 may be thermally treated at about 350–450° C. in an oxygen atmosphere. The oxygen atmosphere may contain about 4–6% oxygen ($O_2$) and about 94–96% nitrogen ($N_2$). The thermal treatment (reflow process) may reduce or prevent the occurrence of seams in the ruthenium oxide layer 142.

As shown in FIG. 7B, the ruthenium oxide layer 142 and the ruthenium layer 136 are chemically and mechanically polished to expose the second etch stopper 125. As a result, capacitor nodes defined by the ruthenium oxide layer 142 and the ruthenium layer 136 are separated from neighboring nodes that may also be defined by ruthenium oxide and ruthenium layers. Reference numerals 136a and 142a are used in FIG. 7B to indicate the ruthenium layer 136 and ruthenium oxide layer 142 after the second etch stopper 125 is exposed.

As also illustrated in FIG. 7B, the remaining second etch stopper 125 has been removed, for example, by wet etching, and the mold oxide layer 120 and the first etch stopper 115 have been removed by known techniques to form a lower electrode 146. It will be understand that, in addition to the illustrated and described operations related to the present invention, subsequent processes may be carried out, including those such as described with reference to FIG. 3D to complete fabrication of a MIM capacitor including the lower electrode 146.

The embodiments described with reference to FIGS. 7A and 7B differ from those described with reference to FIGS. 3A–3D in that the ruthenium oxide layer is formed before node separation. However, in each case, the characteristics of the ruthenium oxide layer remaining in the lower electrode 145, 146 may be substantially the same.

Figure 8A:
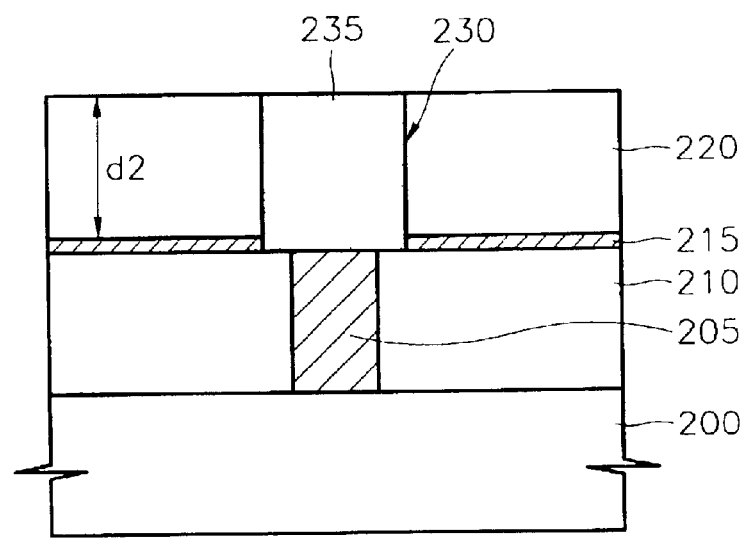
FIGS. 8A through 8C are cross-sectional diagrams illustrating manufacturing of a MIM capacitor according to further embodiments of the present invention.
Figure 8B:
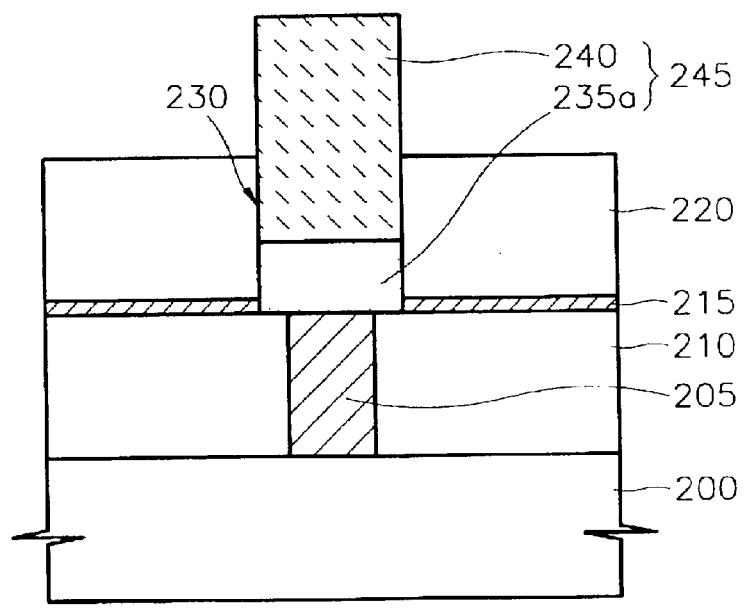
Figure 8C:
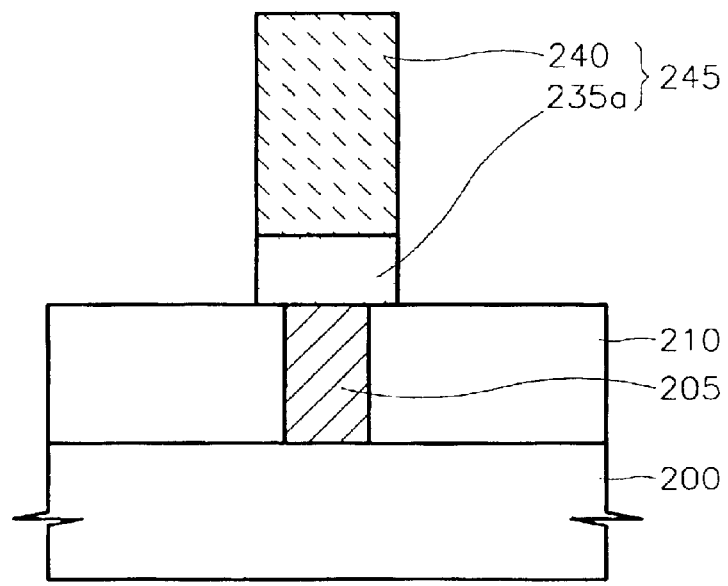

Further embodiments of the present invention will now be described with reference to FIGS. 8A–8C. FIGS. 8A through 8C are cross-sectional diagrams illustrating operations for manufacturing a MIM capacitor according to further embodiments of the present invention. Referring first to FIG. 8A, an interlevel insulating (first dielectric) layer 210 including a conductive contact plug 205 is deposited on an integrated circuit (semiconductor) substrate 200. It is to be understood that the integrated circuit substrate 200 includes other components not illustrated in FIG. 8A, for example, a MOS transistor associated with a memory cell including the capacitor to be formed as will now be described.

A first etch stopper 215, a mold oxide (second dielectric) layer 220 and a second etch stopper are sequentially deposited on the interlevel insulating layer 210. The first and second etch stoppers may be formed in generally the same manner and of the same materials as described above with reference to FIGS. 3A–3D. However, the thickness d2 of the deposited mold oxide layer 220, in accordance with the embodiments illustrated in FIGS. 8A–8C, is selected to be thinner than the thickness d1 of the mold oxide layers described previously for a lower electrode region 230 having substantially the same diameter as those described with reference to FIGS. 3A–3D and 7A–7B. More particularly, the thickness d2 of the mold oxide layer 220 is selected so that a ruthenium layer 235 is deposited that fills the lower electrode region 230, substantially without seams as compared to embodiments in which the aspect ratio of the lower electrode region 230 would otherwise result in a problem with introduction of such seams during deposition of the ruthenium layer 235.

Selected portions of the mold oxide layer 220 and the first etch stopper 215 are etched to expose the conductive contact plug 205, thus forming an aperture defining the lower electrode region 230. A conductive layer, such as the ruthenium layer 235, is deposited to substantially fill the aperture defining the lower electrode region 230. The deposited ruthenium layer 235 may be partially removed, for example, by chemical and/or mechanical polishing, until a second etch stopper (see, for example, etch stopper 125 in FIG. 3B) is exposed. The second etch stopper is removed to provide the resulting structure illustrated in FIG. 8A.

Referring now to FIG. 8B, the ruthenium layer 235 in the lower electrode region 230 is oxidized, for example, at about 140–160° C. in a plasma atmosphere containing about 4–6% oxygen ($O_2$) and about 94–96% nitrogen ($N_2$). The ruthenium layer 235 may also be thermally treated at about 350–450° C. in an oxygen atmosphere. As a result of such processing, a ruthenium oxide layer 240 having a smooth surface is formed on the ruthenium layer 235 to define a lower electrode 245 that includes the remaining ruthenium layer 235a and the ruthenium oxide layer 240. Thus, as a result of these operations, the ruthenium oxide layer 240 results from oxidization to expand the volume of the ruthenium layer 235. This vertical expansion provides a node having a height greater than the thickness d2 of the mold oxide layer 220. More particularly, the ruthenium oxide layer 240 may be grown to a desired thickness as needed for the desired capacitance of a MIM capacitor including a lower electrode 245 of a desired height.

As shown in FIG. 8C, the mold oxide layer 220 and the first etch stopper 215 may then be removed by conventional methods. In addition, additional processes may be carried out as described, for example, with reference to FIG. 3D, to complete fabrication of a MIM capacitor. In accordance with the embodiments illustrated in FIGS. 8A–8C, the thickness of a mold oxide layer used during fabrication of a MIM capacitor may be relatively thinner than would otherwise be required to provide the desired height for the resultant lower electrode. This reduced thickness may beneficially lower the aspect ratio of the lower electrode region during deposition of a conductive layer, such as a ruthenium layer. Thereafter, the ruthenium layer is oxidized to form a ruthenium oxide layer of a desired thickness, thereby increasing the height of the lower electrode so as to provide a desired capacitance of a MIM capacitor including the lower electrode.

Figure 9:
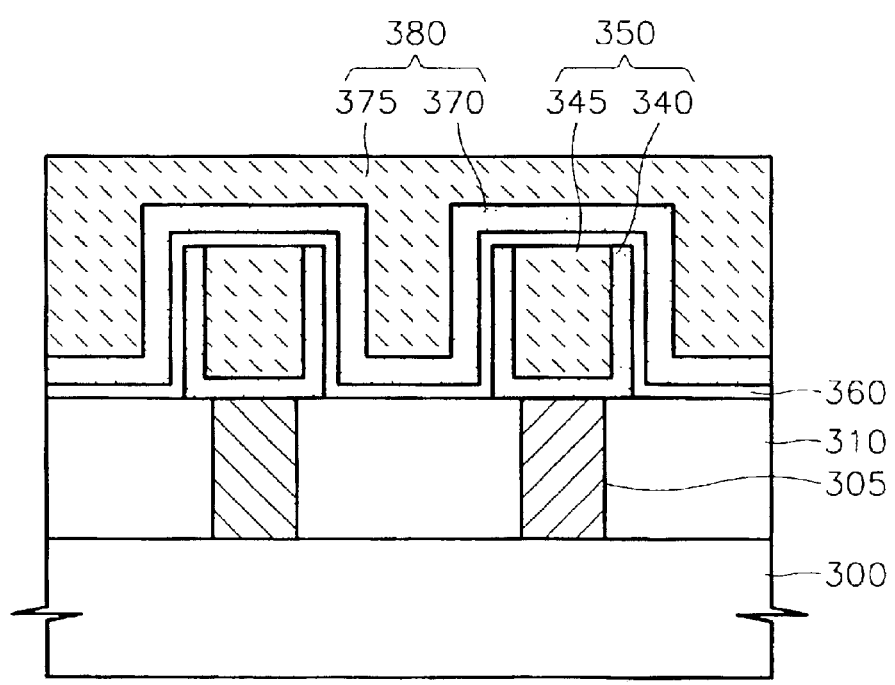
FIG. 9 is a cross-sectional diagram of a MIM capacitor according to yet further embodiments of the present invention.

Further embodiments of the present invention will now be described with reference to FIG. 9. FIG. 9 is a cross-sectional diagram of a MIM capacitor illustrating embodiments of the present invention as further applied to an upper electrode of the MIM capacitor. As shown in FIG. 9, an interlevel insulating (first dielectric) layer 310 including a conductive contact plug 305 is deposited on an integrated circuit (semiconductor) substrate 300. A lower electrode 350 is formed that contacts the conductive contact plug 305. The lower electrode 350 may include a ruthenium layer 340 and a ruthenium oxide layer 345 formed as described above. More particularly, the lower electrode 350 illustrated in FIG. 9 may be formed as described above with reference to FIGS. 3A–3D or 7A–7B. However, the lower electrode 350 may also be formed as described with reference to FIGS. 8A–8C or by conventional methods in various embodiments of the present invention.

A capacitor dielectric layer 360 is deposited that extends over the lower electrode 350 and the interlevel insulating layer 310. As shown in FIG. 9, the dielectric layer 360 extends over two lower electrode nodes. However, it is to be understood that a greater number of lower electrode nodes or a single node may be provided in accordance with various embodiments of the present invention. The dielectric layer 360 may be formed of a material and in a manner such as described above with reference to the dielectric layer 150 in FIG. 3D.

A ruthenium layer 370 is deposited on the dielectric layer 360 to provide a conductive layer defining an upper electrode. More particularly, the ruthenium layer 370 is oxidized to provide a ruthenium oxide layer 375. The ruthenium layer 370 and the ruthenium oxide layer 375 define an upper electrode. In the embodiments illustrated in FIG. 9, the ruthenium oxide layer 375 fills a space between the multiple lower electrodes 350 to form an upper electrode 380 for both of the illustrated lower electrodes.

As with the operations described above related to fabrication of a lower electrode, the ruthenium oxide layer 375 may also be oxidized at about 140–160° C. in a plasma atmosphere containing about 4–6% oxygen ($O_2$) and about 94–96% nitrogen ($N_2$). The ruthenium layer 375 may be thermally treated at about 350–450° C. in an oxygen atmosphere after oxidizing. The conductive layer 370 of the upper electrode may be ruthenium but may also be other conductive materials, for example, tungsten (W) or iridium (Ir). As with the lower electrode embodiments described above, the selected conductive material may provide a conductive layer and conductive oxide layer having work functions that are sufficiently close to allow the layers to act together as the upper electrode. In addition, a high-temperature reflow process may be performed on the conductive oxide layer 375. Accordingly, in various embodiments of the present invention, an upper electrode may be provided having substantially no seams as described previously for the lower electrode nodes.

It should be noted that many variations and modifications may be made to the embodiments described above without substantially departing from the principles of the present invention. All such variations and modifications are intended to be included herein within the scope of the present invention, as set forth in the following claims.

We claim:

1. A method of manufacturing a node of a stacked capacitor, the method comprising:

forming a first dielectric layer having a contact plug therein on an integrated circuit substrate;

forming a second dielectric layer including a storage node hole adjacent the contact plug on the first dielectric layer;

depositing a conductive layer into the storage node hole and on the second dielectric layer, the conductive layer having an associated work function;

oxidizing the conductive layer to form a conductive oxide layer on the conductive layer, the conductive oxide layer having an associated work function that is sufficiently close to the work function of the conductive layer that the conductive layer and the conductive oxide layer operate together as the node of the stacked capacitor; and removing the second dielectric layer to define the node of the stacked capacitor.

2. The method of claim 1 wherein the stacked capacitor is a metal-insulator-metal (MIM) capacitor and wherein the conductive layer is formed of a material selected from the group consisting of ruthenium (Ru), tungsten (W) and iridium (Ir).

3. The method of claim 2 wherein depositing the conductive layer comprises depositing the conductive layer in a cup shape in the storage node hole and wherein oxidizing the conductive layer comprise forming the conductive oxide layer in the cup shaped conductive layer to substantially fill the storage node hole.

4. The method of claim 2 wherein depositing the conductive layer comprises depositing the conductive layer to substantially fill the storage node hole and wherein oxidizing the conductive layer comprises forming the conductive oxide layer extending from the conductive layer above the storage node hole.

5. The method of claim 2 wherein oxidizing the conductive layer comprises oxidizing the conductive layer at about 140° C. to about 160° C. in a plasma atmosphere containing about 4% to about 6% oxygen ($O_2$) and about 94% to about 96% nitrogen ($N_2$).

6. The method of claim 5 wherein oxidizing the conductive layer is followed by thermally treating the conductive oxide layer at about 350° C. to about 450° C. in an oxygen atmosphere.

7. The method of claim 2 wherein oxidizing the conductive layer is followed by reflowing the conductive layer and the conductive oxide layer.

8. The method of claim 2 wherein the node is a lower electrode of the stacked capacitor and wherein removing the second dielectric layer is followed by:
   forming a capacitor dielectric layer on the node of the stacked capacitor; and
   depositing a second conductive layer on the capacitor dielectric layer to define an upper electrode of the stacked capacitor.

9. The method of claim 8 wherein depositing the second conductive layer comprises:
   depositing a conductive layer on the capacitor dielectric layer; and
   oxidizing the conductive layer on the capacitor dielectric layer to form a conductive oxide layer, the conductive layer on the dielectric layer having a work function substantially the same as a work function of the conductive oxide layer on the capacitor dielectric layer so that they operate together as the upper electrode of the capacitor.

10. The method of claim 9 wherein a plurality of lower electrodes are formed on the integrated circuit substrate and wherein the conductive oxide layer on the capacitor dielectric extends between ones of the plurality of lower electrode to define an upper electrode for the ones of the plurality of lower electrodes.

11. A method of manufacturing a node of a stacked capacitor, the method comprising:
   forming a first dielectric layer having a contact plug therein on an integrated circuit substrate;
   forming a second dielectric layer including a storage node hole adjacent the contact plug on the first dielectric layer;
   depositing a conductive layer into the storage node hole and on the second dielectric layer;
   oxidizing the conductive layer to form a conductive oxide layer on the conductive layer; and
   removing the second dielectric layer to define the node of the stack capacitor including the conductive layer and the conductive oxide layer.

12. The method of claim 11 wherein the conductive oxide layer has an associated work function that is sufficiently close to a work function of the conductive layer that the conductive layer and the conductive oxide layer operate together as the node of the stacked capacitor.

13. The method of claim 12 wherein the stacked capacitor is a metal-insulator-metal (MIM) capacitor and wherein the conductive layer is formed of a material selected from the group consisting of ruthenium (Ru), tungsten (W) and iridium (Ir).

14. A method for fabricating a metal-insulator-metal (MIM) capacitor, the method comprising:
   forming a mold oxide layer having a conductive plug on a semiconductor substrate;
   etching a predetermined portion of the mold oxide layer to expose the conductive plug so that a lower electrode region is defined;
   filling a conductive layer into the lower electrode region of the mold oxide layer;
   oxidizing the conductive layer to form a conductive oxide layer to be higher than the mold oxide layer; and
   removing the mold oxide layer,
   wherein the mold oxide layer has a thickness such that the conductive layer can be fully reclaimed without seams,
   the conductive oxide layer is a conductive material that has almost the same work function as the conductive layer, and
   the conductive layer is formed of a material selected from the group consisting of ruthenium (Ru), tungsten (W) and iridium (Ir).

15. The method of claim 14, wherein the conductive oxide layer is formed by oxidizing the conductive layer at about 140–160° C. in a plasma atmosphere containing about 4–6% oxygen ($O_2$) and about 94–96% nitrogen ($N_2$).

16. The method of claim 14, wherein, after forming the conductive oxide layer at about 140–160° C. in a plasma atmosphere containing about 4–6% oxygen ($O_2$) and about 94–96% nitrogen ($N_2$), the conductive oxide layer is thermally treated at about 350–450° C. in an oxygen atmosphere.

17. The method of claim 14, wherein, after the conductive oxide layer is formed, the conductive layer and the conductive oxide layer are reflowed at high temperature.

18. A method for fabricating a metal-insulator-metal (MIM) capacitor, comprising:
   forming a plurality of lower electrodes to a predetermined thickness on a semiconductor substrate;
   forming a dielectric layer on the plurality of lower electrodes;
   forming a conductive layer for an upper electrode on the dielectric layer; and
   forming a conductive oxide layer by oxidizing the conductive layer to completely fill a space between ones of the plurality of lower electrodes, thereby forming upper electrode that is made of the conductive layer and the conductive oxide layer,
   wherein the conductive oxide layer is a conductive material that has most the same work function as the conductive layer, and
   the conductive layer, which constitutes the upper electrode, is formed of a material selected from the group consisting of ruthenium (Ru), tungsten (W) and iridium (Ir).

19. The method of claim 18, wherein the conductive oxide layer is made by oxidizing the conductive layer at about 140–160° C. in a plasma atmosphere containing about 4–6% oxygen ($O_2$) and about 94–96% nitrogen ($N_2$).

20. The method of claim 19, wherein after forming the conductive oxide layer at about 140–160° C. in a plasma atmosphere containing about 4–6% oxygen ($O_2$) and about 94–96% nitrogen ($N_2$), the conductive oxide layer is thermally treated at about 350–450° C. in an oxygen atmosphere.

21. The method of claim 18, wherein after the conductive oxide layer is formed, the conductive layer and the conductive oxide layer are reflowed at an elevated temperature.

* * * * *

UNITED STATES PATENT AND TRADEMARK OFFICE
CERTIFICATE OF CORRECTION

PATENT NO. : 6,946,341 B2  Page 1 of 1
DATED : September 20, 2005
INVENTOR(S) : Joo et al.

It is certified that error appears in the above-identified patent and that said Letters Patent is hereby corrected as shown below:

Column 13,
Line 37, should read -- tric extends between ones of the plurality of lower electrodes --.

Column 14,
Line 43, should read -- the plurality of lower electrodes, thereby forming an upper --.
Line 47, should read -- rial that has almost the same work function as the --.

Signed and Sealed this

Eleventh Day of April, 2006

JON W. DUDAS
*Director of the United States Patent and Trademark Office*